(12) United States Patent
Shen

(10) Patent No.: US 6,924,221 B2
(45) Date of Patent: Aug. 2, 2005

(54) INTEGRATED PROCESS FLOW TO IMPROVE COPPER FILLING IN A DAMASCENE STRUCTURE

(75) Inventor: Yun Hung Shen, Hsin-Chu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 33 days.

(21) Appl. No.: 10/308,447

(22) Filed: Dec. 3, 2002

(65) Prior Publication Data

US 2004/0106277 A1 Jun. 3, 2004

(51) Int. Cl.$^7$ .......................................... H01L 21/4763
(52) U.S. Cl. .................... 438/618; 438/622; 438/624; 438/638; 438/639; 438/640; 438/643; 438/678; 438/687; 438/696; 438/724; 438/757
(58) Field of Search .................... 438/618, 622–624, 438/637–640, 678, 687, 696, 758, 757, 643, 724

(56) References Cited

U.S. PATENT DOCUMENTS

| | | | |
|---|---|---|---|
| 5,847,460 A | * 12/1998 | Liou et al. | 257/751 |
| 6,156,648 A | 12/2000 | Huang | 438/654 |
| 6,211,069 B1 | 4/2001 | Hu et al. | 438/637 |
| 6,284,657 B1 | 9/2001 | Chooi et al. | 438/687 |
| 6,291,333 B1 | 9/2001 | Lou | 438/618 |
| 6,440,847 B1 | * 8/2002 | Lou | 438/639 |
| 6,492,270 B1 | * 12/2002 | Lou | 438/687 |

OTHER PUBLICATIONS

Wolf, Ph.D., Stanley, Richard N. Tauber, Ph.D., "Chemical Vapor Deposition of Amorphous and Polycrystalline Films," Silicon Processing for the VLSI Era—vol. 1: Process Technology, Lattice Press, 1986 (pp. 191–194).*

Wolf, Ph.D., Stanley, Richard N. Tauber, Ph.D., "Dry Etching for VLSI Fabrication," Silicon Processing for the VLSI Era—vol. 1: Process Technology, Lattice Press, 1986 (pp. 539–542).*

* cited by examiner

Primary Examiner—Mary Wilczewski
Assistant Examiner—Toniae M. Thomas
(74) Attorney, Agent, or Firm—Thomas, Kayden, Horstemeyer & Risley

(57) ABSTRACT

A process for fabricating a dual damascene structure of copper has been developed. This process uses a thin nitride spacer, approximately 100 Angstroms thick, at the bottom of the via, thus preventing recessed nitride during the resist stripping process.

26 Claims, 7 Drawing Sheets

INTEGRATED PROCESS FLOW TO IMPROVE COPPER FILLING IN A DAMASCENE STRUCTURE

BACKGROUND OF THE INVENTION (1) Field of the Invention

This invention relates to a method of fabrication used for semiconductor integrated circuit devices, and more specifically to the formation of a thin nitride spacer, approximately 100 Angstroms thick, at the bottom of the via, in dual damascene copper processing, thus preventing recessed nitride during the resist stripping process.

(2) Description of Related Art

In this section a description of related Prior Art background patents follows.

U.S. Pat. No. 6,291,333 B1 entitled "Method Of Fabricating Dual Damascene Structure" granted Sep. 18, 2001 to Lou describes a dual damascene process with barrier layer spacers. A silicon oxide layer, a stop layer, a low k organic dielectric layer, and a cap layer are formed in sequence on a substrate. A trench is formed in the cap layer and the low k organic dielectric layer, while a via opening is formed in the stop layer and the silicon oxide layer. A part of the stop layer is removed to form a cavity below the low k organic dielectric layer, followed by forming fluorinated polyarlyethers spacers on sidewalls of the trench and the via opening which fills the cavity. The trench and the via opening are then filled with a copper layer to form a dual damascene structure.

U.S. Pat. No. 6,284,657 B1 entitled "Non-Metallic Barrier Formation For Copper Damascene Type Interconnects" granted Sep. 4, 2001 to Chooi et al. describes a dual damascene process with spacers. The method forms dual-damascene type conducting interconnects with non-metallic barriers that protect the interconnects from fluorine out-diffusion from surrounding low-k, fluorinated dielectric materials. One embodiment of the method is particularly suited for forming such interconnects in microelectronics fabrications of the sub 0.15 micron generation.

U.S. Pat. No. 6,211,069 B1 entitled "Dual Damascene Process Flow For A Deep Sub-Micron Technology" granted Apr. 3, 2001 to Hu et al. discloses a dual damascene process with sidewall spacers. The process for forming a dual damascene opening, in a composite insulator layer, is comprised of an overlying, wide diameter opening, used to accommodate a metal interconnect structure, and an underlying, narrow diameter opening, used to accommodate a metal via structure. The process features the use of conventional photo-lithographic and anisotropic dry etching procedures, used to create an initial dual damascene opening, in the composite insulator layer. The subsequent formation of insulator spacers, on the vertical sides of the initial dual damascene opening, however, results in a final dual damascene opening, featuring a diameter smaller than the diameter displayed with the initial dual damascene opening.

U.S. Pat. No. 6,156,648 entitled "Method For Fabricating Dual Damascene" granted Dec. 5, 2000 to Huang describes a dual damascene process with sidewall spacers. A cap layer and a dielectric layer are formed in sequence over a substrate having a first conductive layer. A trench and a via hole are formed in the dielectric layer. The via hole is aligned under the trench. A barrier spacer is formed on sidewalls of the trench and the via hole. The cap layer exposed by the via hole is removed. A conformal adhesion layer is formed over the substrate. A second conductive layer is formed over the substrate and fills the trench and the via hole. A portion of the second conductive layer and the adhesion layer are removed to expose the dielectric layer.

SUMMARY OF THE INVENTION

It is a general object of the present invention to provide an improved method of forming an integrated circuit in which a new process for fabricating a dual damascene structure of copper has been developed. Conventional methods use silicon nitride as a protective liner of the dual damascene trench/via. However, problems arise with the conventional methods due to recessed nitride at the damascene bottom via area, which affects the performance of the subsequent copper fill, and makes for a noncontinuous barrier coating at the bottom of the via. This improved and new process uses a thin nitride spacer, approximately 100 Angstroms thick, at the bottom of the via, thus preventing recessed nitride during the resist stripping process.

The process flow summary is as follows:
(1) Damascene via & trench patterned and etched
(2) Deposit of a thin nitride film (100 A)
(3) Etch the pre nitride film and liner nitride film at the same process, it form the nitride spacer at the via bottom area
(4) Strip the photoresist This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide an improved method of forming an integrated circuit in which a new process for fabricating a dual damascene structure of copper has been developed. Conventional methods use silicon nitride as a protective liner of the dual damascene trench/via. However, problems arise with the conventional methods due to recessed nitride at the damascene bottom via area, which affects the performance of the subsequent copper fill, and makes for a noncontinuous barrier coating at the bottom of the via. This improved and new process uses a thin nitride spacer, approximately 100 Angstroms thick, at the bottom of the via, thus preventing recessed nitride during the resist stripping process.

Figure 1A:
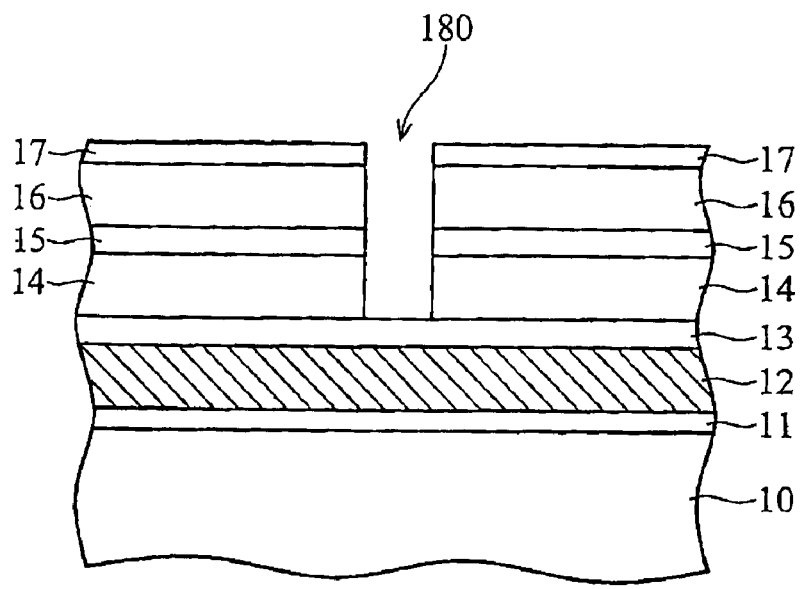
FIGS. 1A–1D, which in cross-sectional representation illustrate the Prior Art method, in which the SiN liner is attacked causing lateral recess of the SiN liner and impacting the TaN barrier deposition.

The process flow summary is as follows: (See FIG. 3)
(1) Damascene via & trench patterned and etched (2) Blanket Deposit one thin nitride film, ~100 Angstroms
(3) Etch the pre-nitride film and liner nitride film at the same process, forming the nitride spacer at the via bottom area
(4) Strip the photoresist Referring to FIGS. 1A–1D, which in cross-sectional representation illustrate the Prior Art method, in which the SiN liner is attacked causing lateral recess of the SiN liner and impacting the TaN barrier deposition. Referring to FIG. 1A, which in cross-sectional representation illustrates the start of the Prior Art method. The Prior Art layers provided in FIG. 1A, are as follows: a semiconductor substrate 10, an insulating layer 11, and a patterned conducting metal wiring 12 embedded in an insulator, which is not shown in the cross-sectional figures. The semiconductor substrate 10 includes one or more layers of insulating material and/or conductive material and one or more active and/or passive devices, formed in or over the substrate, or the like, and one or more interconnect structures, such as, vias, contacts, trenches, metal wiring and the like. A first passivation layer 13, which is an insulator, preferably silicon nitride, is deposited over the patterned conducting wiring 12. Next, a first low dielectric constant material layer 14, which is CVD fluorine doped $SiO_2$, is deposited over the first passivation layer 13, which acts as an both an insulating layer and an etch stop in dual damascene processing. A second passivation layer 15, which is an insulator, preferably silicon nitride, which is both an insulating layer and an etch stop in dual damascene processing, is deposited over the first low dielectric constant material layer 14. The next process step, in a dual damascene build, is the deposition of a second low dielectric material layer 16, which is CVD fluorine doped $SiO_2$ over the second passivation layer 15. Next, a third passivating layer 17, which is SiON, is deposited over the second low dielectric constant material layer 16. After a via photoresist patterning and etching steps, a via opening 180 (arrow) is formed etching down to the first passivating layer 13.

Figure 1B:
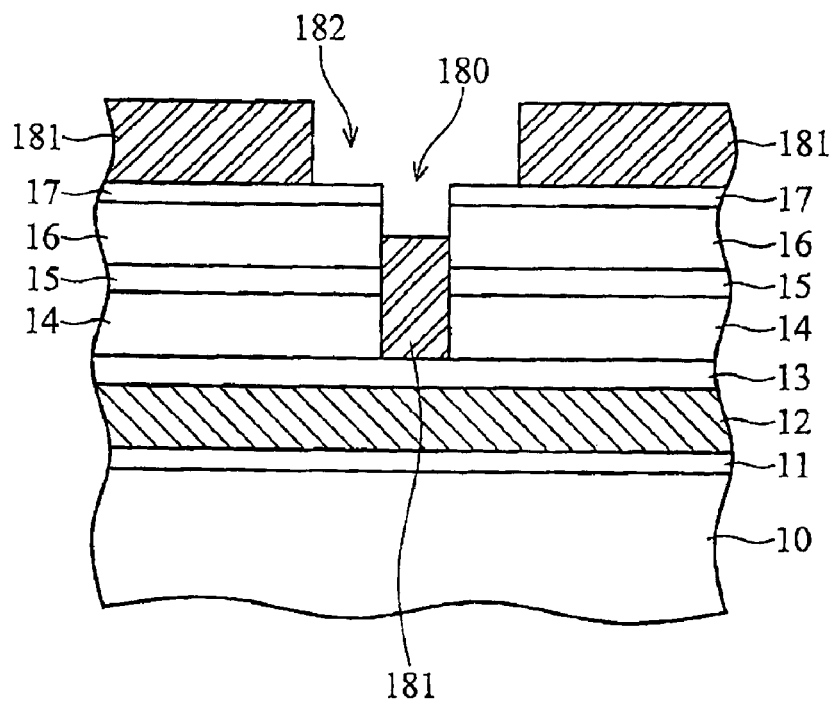

Referring to FIG. 1B, which in cross-sectional representation illustrates a part of the Prior Art method, the start of forming of a dual damascene trench opening 182 (arrow) with a photoresist via plug. Patterned photoresist 181 is formed over the third passivating layer 17 and a photoresist via plug is formed 181 in the via opening 180 (arrow).

Figure 1C:
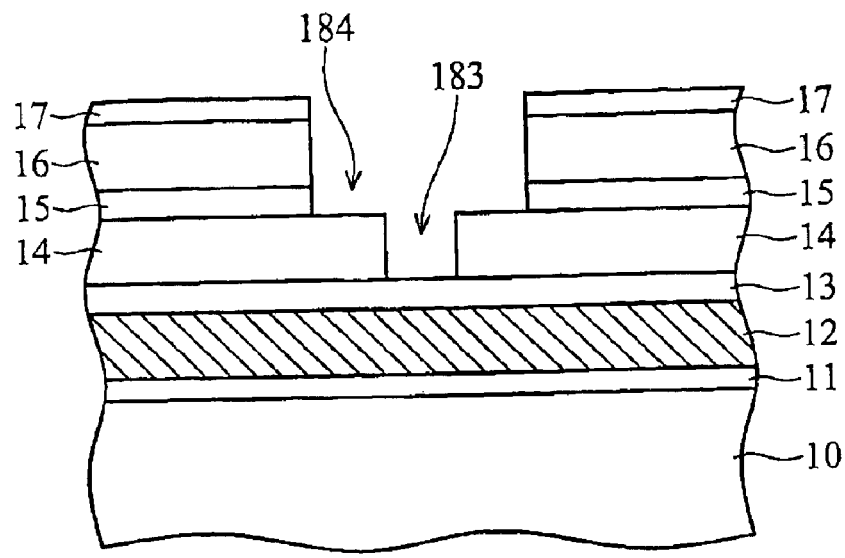

Referring to FIG. 1C, which in cross-sectional representation illustrates a final step of the Prior Art method, the final forming of a dual damascene trench opening 184 (arrow) and via opening 183 (arrow). The trench opening is formed by etching and all photoresist is removed or stripped including the photoresist plug.

Figure 1D:
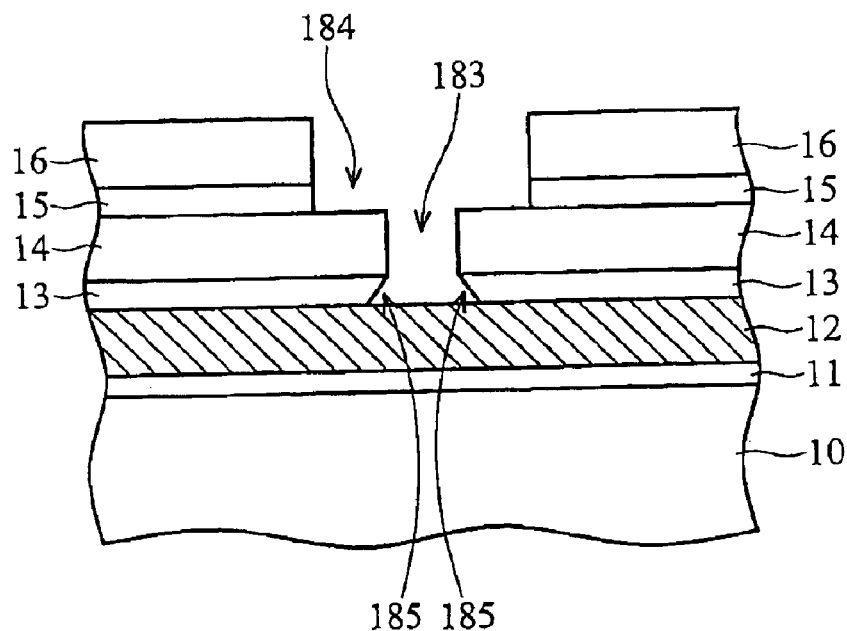

Referring to FIG. 1D, which in cross-sectional representation illustrate the Prior Art method, in which the SiN liner is attacked causing lateral recess of the SiN liner 85 (arrows) and impacting the subsequent TaN barrier deposition. The SiN liner, which is the first passivating layer 13, is etched through to the underlying metal wiring layer 12. However, in a final photoresist strip, the stripping solution SEZ, containing fluorine liner attacks the SiN liner causing lateral recess of the SiN liner 85 (arrows) and impacting the subsequent TaN barrier deposition. The remaining conventional processing step, in dual damascene, are the forming of: a barrier layer mentioned above, a copper seed layer and a thick plated copper layer filling the trench/via openings and forming excess copper. The excess copper is chemical mechanical polished back to planarize the surface, forming inlaid copper interconnect wiring and contact vias. However, the reliability of the wiring and contact vias is impacted, due to the poor structures made and the poor barrier layer coverage.

Figure 2A:
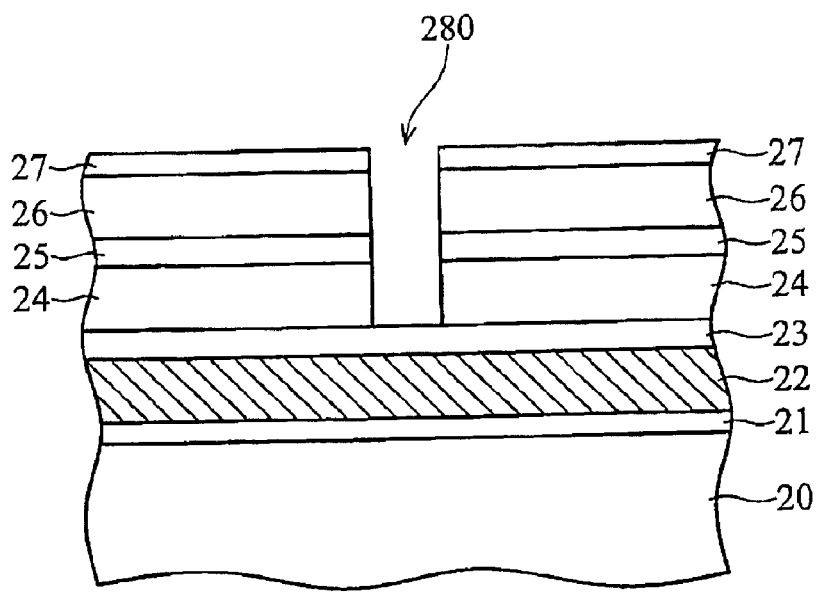
FIGS. 2A–2G, which in cross-sectional representation illustrate the method of the present invention, in which a nitride spacer is formed at the via bottom to prevent a nitride recess caused by resisting stripping.

Referring to FIGS. 2A–2G, which in cross-sectional representation illustrate the method of the present invention, in which a nitride spacer is formed at the via bottom to prevent a nitride recess caused by resist stripping. Referring to FIG. 2A, which in cross-sectional representation illustrates the start of the method of the present invention. For completeness, provided layers in FIG. 2A, are as follows: a semiconductor substrate 20, an insulating layer 21, and a patterned conducting metal wiring 22 embedded in an insulator, which is not shown in the cross-sectional figures. The semiconductor substrate 20 includes one or more layers of insulating material and/or conductive material and one or more active and/or passive devices, formed in or over the substrate, or the like, and one or more interconnect structures, such as, vias, contacts, trenches, metal wiring and the like. A first passivation layer 23, which is an insulator, preferably silicon nitride, is deposited over the patterned conducting wiring 22. Next, a first low dielectric constant material layer 24, which is CVD fluorine doped $SiO_2$, is deposited over the first passivation layer 23, which acts as both an insulating layer and an etch stop in dual damascene processing. A second passivation layer 25, which is an insulator, preferably silicon nitride, which is both an insulating layer and an etch stop in dual damasceno processing, is deposited over the first low dielectric constant material layer 24. The next process step, in a dual daxnascene build, is the deposition of a second low dielectric material layer 26, which is CVD fluorine doped $SiO_2$, FSG, over the second passivation layer 25. Next, a third passivating layer 27, which is SiON, is deposited over the second low dielectric constant material layer 26. After a via photoresist patterning and etching steps, a via opening 280 (arrow) is formed etching down to the first passivating layer 23.

Figure 2B:
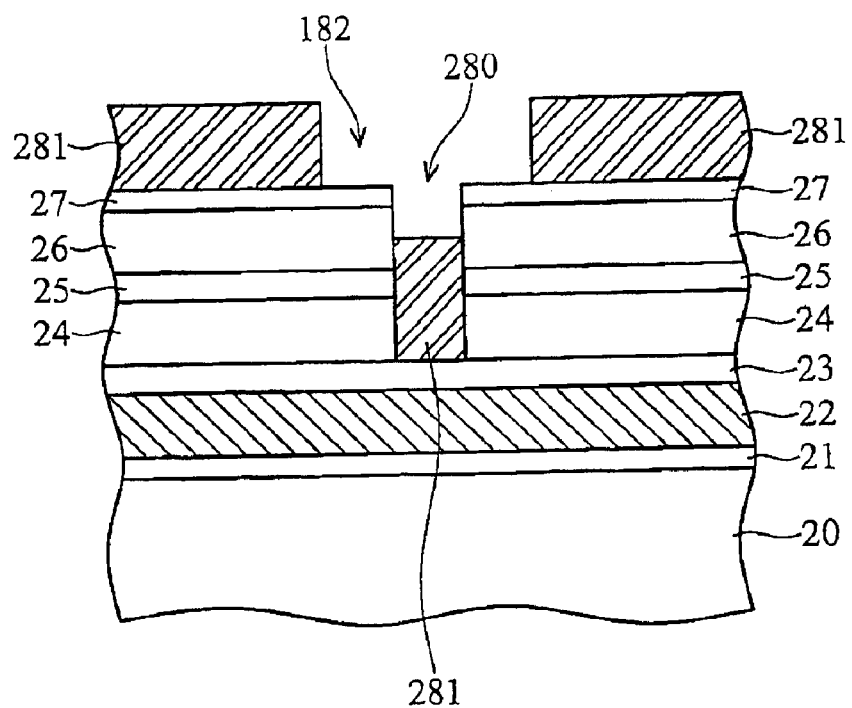

Referring to FIG. 2B, which in cross-sectional representation illustrates a part of the method of the present invention, the start of forming of a dual damascene trench opening 182 (arrow) with a photoresist via plug. Patterned photoresist 281 is formed over the third passivating layer 27 and a photoresist via plug is formed 281 in the via opening 280 (arrow).

Figure 2C:
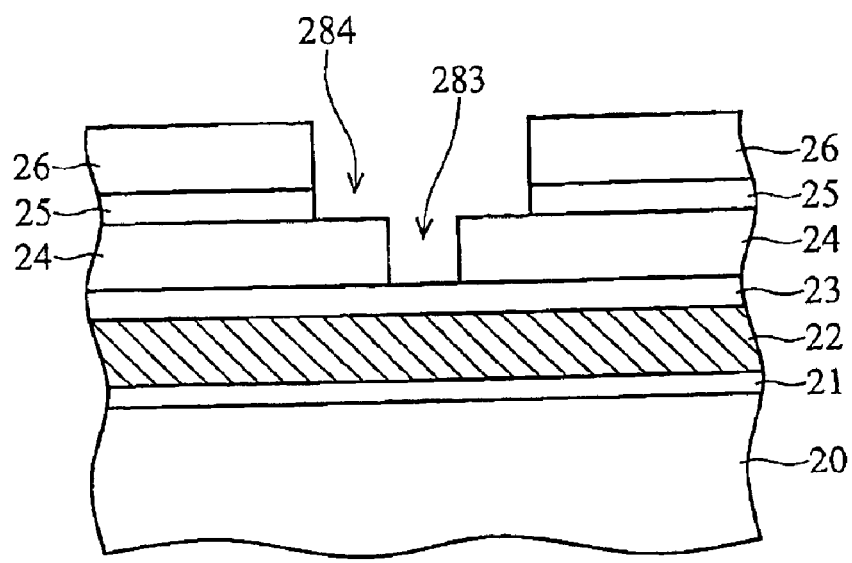

Referring to FIG. 2C, which in cross-sectional representation illustrates another processing step in the method of the present invention, the final forming of a dual damascene trench opening 284 (arrow) and via opening 283 (arrow). The trench opening is formed by etching and all photoresist is removed or stripped including the photoresist plug. In addition, the third passivating layer is also removed.

Figure 2D:
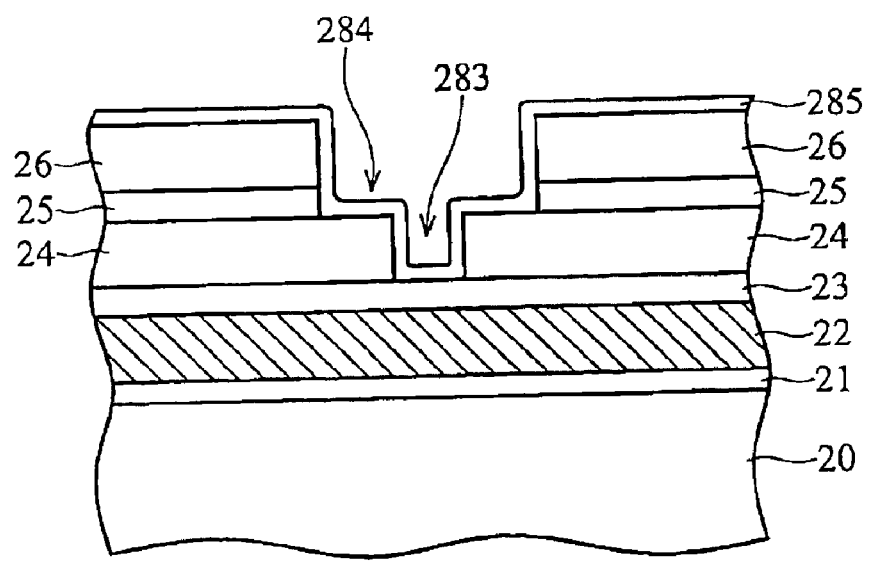

Referring to FIG. 2D, which in cross-sectional representation illustrates a key processing step in the method of the present invention, a blanket deposition of approximately 80 to 150 Angstrom thick PECVD, plasma enhanced chemical vapor deposited SiN layer ( 285 ), which is conformally deposited over the damascene trench opening 284 (arrow) and via opening 283 (arrow). In addition, PECVD SiN layer 285, also deposits over: (a) the exposed portion of the first passivation layer 23, (b) the exposed portion of the first low dielectric constant material layer 24, (c) and over the second low dielectric material layer 26, as shown in FIG. 2D.

Figure 2E:
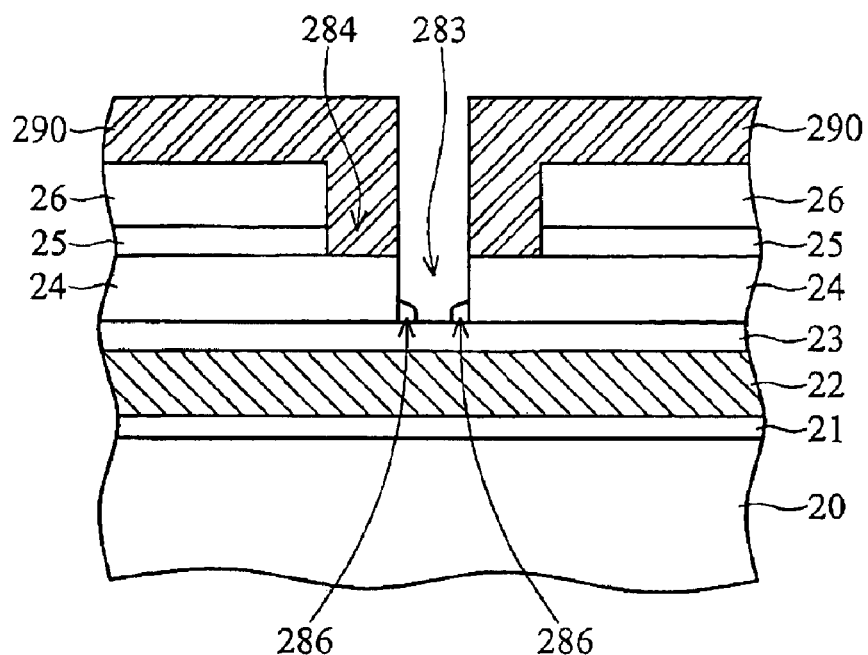

Referring to FIG. 2E, which in cross-sectional representation illustrates another key processing step in the method of the present invention, that is, the etching back of the PECVD SiN conformal layer. A reactive ion etch back process of the the PECVD SiN conformal layer, results in a small portion of SiN 286 (arrows) remaining near the bottom of the via, forming "wedge shaped" pieces, that act a sacrificial film.

Figure 2F:
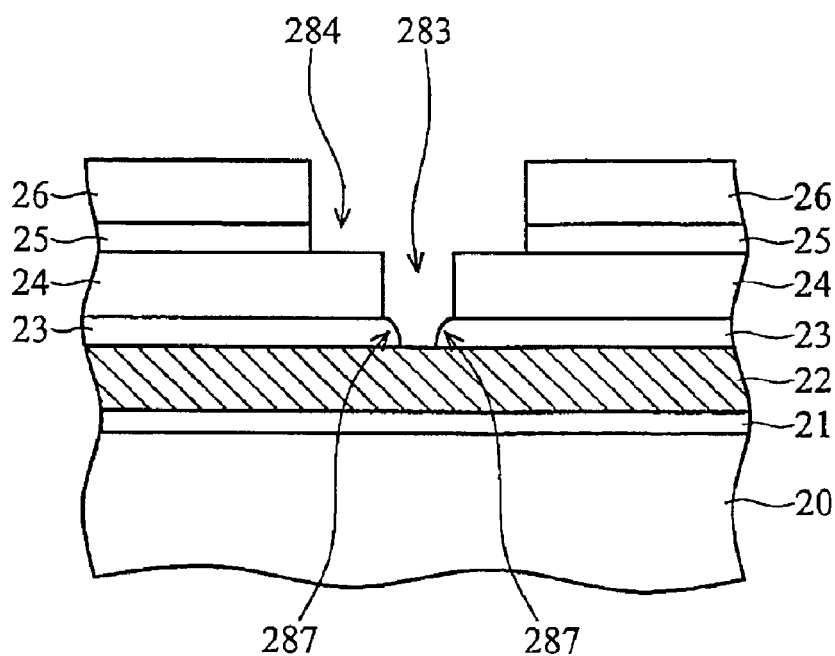

Referring to FIG. 2F, which in cross-sectional representation illustrates yet another key processing step in the method of the present invention, that is, the removal of the SiN spacer at the bottom of the via, and the exposed portion of the first passivation layer. Photoresist 290 is provided and patterned to expose the SiN spacer at the bottom of the via, as shown in FIG. 2E. Note, the small portion of the SiN that remained near the bottom of the via, the "wedge shaped" pieces or "PE SiN spacer", mentioned above in FIG. 2E, serves to protect the bottom of the via 283 (arrow) from chemical attack and undercutting. The PE SiN spacer at the boom of the via, acting as a sacrificial film, is then consumed by an SEZ (trade name), during a photoresist stripping process, which is a spun-on solution containing fluorine, along with an exposed portion of the first passivating layer 23. The net effect of the above processes, strips the photoresist 290 and leaves the bottom of the via 283 (arrow) with the sidewalls shaped 287 (arrows), as shown in FIG. 2F. Therefore, SiN spacer at the bottom of the via, which is consumed by the SEZ photoresist striping steps, acts as a sacrificial film.

Figure 2G:
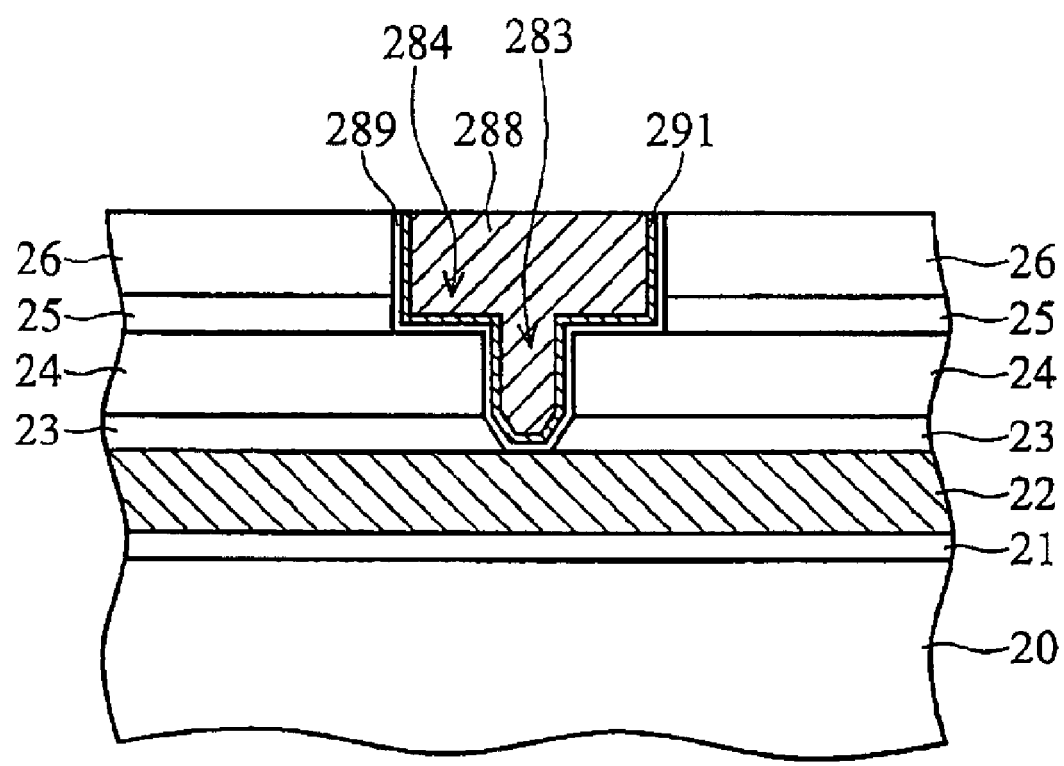

Referring to FIG. 2G, which in cross-sectional representation illustrates the final processing steps in the method of the present invention, the filling of trench/via opening or cavity with conducting metal 288, in a dual damascene process. After trench/via opening or cavity definition, the trench/via is filled with a blanket deposition of a barrier layer 289. The barrier layer 289 is approximately 50 to 2,000 Angstroms thick and is composed of TaN. Electroplating requires the deposition of a copper seed layer 291 over the barrier layer 289. The copper seed layer 291 thickness comprises thickness ranges from 50 to 2,000 Angstroms and is deposited by chemical vapor deposition (CVD) or by sputtering, physical vapor deposition (PVD). The barrier layer material, completely lines the trench/via opening or cavity, and are on the two layers of low dielectric constant insulator, 24 and 26, respectively. Next, thick conducting copper 288 is deposited, by either electroplating (preferred method) or by electroless plating, upon the copper seed layer. Copper electroplating is the preferred method for obtaining the thick copper. The thick copper layer 288, or copper alloys, dips into the trench/via opening or cavity. The plated thick copper deposition is approximately from 1 to 10 microns in thickness. The plated thick copper undergoes an annealing step using rapid thermal annealing (RTA) ramping the temperature from between 50 to 450° C.

Referring yet again to FIG. 2G, in cross-sectional representation, illustrates the planarization of the excess material in the trench opening 284 (arrow) and via opening 283 (arrow) to form both conducting interconnect wiring and conducting contact via, with inlaid copper 288 in a dual damascene process. The excess material in the thick copper layer is polished back and planarized, along with the barrier metal layer, by chemical mechanical polish (CMP). Note, key to the present invention is the special formation of the bottom of the via, which allows for good coverage of the barrier layer. The above processing steps are repeated to produce multi-level metal wiring and contact via layers.

Figure 3:
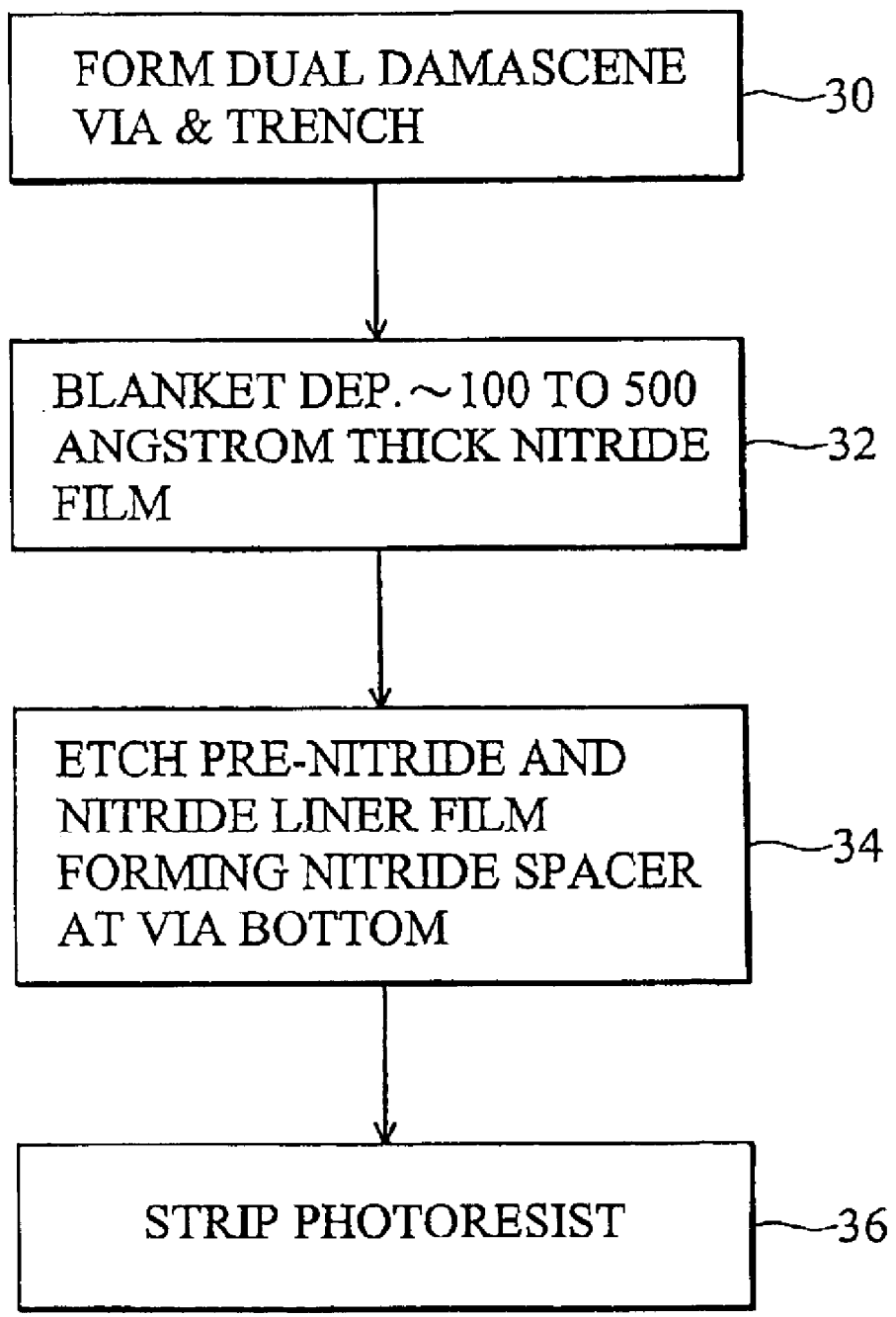
FIG. 3 is a flow chart of outlining the method of the present invention.

Referring to FIG. 3, which is a flow chart of outlining the method of the present invention. First, a dual damascene process is performed to form dual damascene via and trench 30 openings. Next, a blanket deposition of approximately 80 to 150 Angstrom thick PECVD, plasma enhanced chemical vapor deposited SiN layer 32, which is conformally deposited over the damascene trench/via opening is performed. Next, the pre-nitride, a third passivation layer, and nitride liner film are etched simultaneously 34, forming a nitride spacer at the bottom of the via. Finally, the SiN spacer at the bottom of the via, which consists of the exposed portion of the first passivation layer, is removed. Photoresist is provided and patterned to expose the SiN spacer at the bottom of the via. The small portion of the SiN that remains near the bottom of the via, are "wedge shaped" pieces that serve to protect the bottom of the via from chemical attack and undercutting. The SiN spacer at the bottom of the via, acts as a sacrificial film, is then consumed by SEZ (trade name), by a photoresist stripping 36 process, which is spun-on, using a solution containing fluorine. The net effect of the above processes strips the photoresist away, and leaves the bottom of the via with good sidewalls shapes, for subsequent barrier, seed and thick copper formation.

While the invention has been particularly shown and described with reference to the preferred embodiments thereof, it will be understood by those skilled in the art that various changes in form and details may be made without departing from the spirit and scope of the invention.

What is claimed is:

1. A method in dual damascene processing, for fabrication of trench and via openings, the method comprising:

providing an insulating layer overlying a semiconductor substrate;

providing a patterned metal wiring layer over said insulating layer;

depositing a first passivating layer over said metal wiring layer;

depositing a first low dielectric constant layer over said first passivating layer;

depositing a second passivating layer over said first low dielectric constant layer;

depositing a second low dielectric constant layer over said second passivating layer;

forming via and trench openings in said first and second low dielectric constant layers;

blanket depositing by plasma enhanced chemical vapor deposition, a SiN conformal layer over said via and trench openings;

etching back of said SiN conformal layer forming a plasma enhanced SiN spacer at the bottom of the via opening and exposing a portion of the first passivating layer;

providing patterned photoresist to expose the SiN spacer at the bottom of the via and expose a portion of the first passivating layer;

removal of the SiN spacer at the bottom of the via, and the exposed portion of the first passivating layer, thus forming properly shaped trench and via openings in dual damascene.

2. The method of claim 1, wherein said semiconductor substrate includes semiconductor device structures such as gate electrodes and source/drain regions.

3. The method of claim 1, wherein said semiconductor substrate includes semiconductor device structures such as gate electrodes, source/drain regions, and multiple levels of metal interconnections.

4. The method of claim 1, wherein said first and second low dielectric layers are a low dielectric constant material or materials selected from the group halogenated SiO, fluorinated silicate glass, deposited by chemical vapor deposition.

5. The method of claim 1, wherein said first and second passivating layers are comprised of SiN.

6. The method of claim 1, wherein said plasma enhanced chemical vapor deposited, SiN conformal layer is selected from group consisting of SiN, thickness in the range between approximately 80 to 150 Angstroms.

7. The method of claim 1, wherein said etching back of the SiN conformal layer to form a plasma enhanced SiN spacer at the bottom of the via opening, is performed by a reactive ion etch.

8. A method in dual damascene processing, for fabrication inlaid copper interconnect wiring and contact vias, the method comprising:

(a) providing an insulating layer overlying a semiconductor substrate;

(b) providing a patterned metal wiring layer over said insulating layer;

(c) depositing a first passivating layer over said metal wiring layer;

(d) depositing a first low dielectric constant layer over said first passivating layer;

(e) depositing a second passivating layer over said first low dielectric constant layer;

(f) depositing a second low dielectric constant layer over said second passivating layer;

(g) forming via and trench openings in said first and second low dielectric constant layers;

(h) blanket depositing by plasma enhanced chemical vapor deposition, a SiN conformal layer over said via and trench openings;

(i) etching back of said SiN conformal layer forming a plasma enhanced SiN spacer at the bottom of the via opening and exposing a portion of the first passivating layer;

(j) providing patterned photoresist to expose the SiN spacer at the bottom of the via and expose a portion of the first passivating layer;

(k) removal of the SiN spacer at the bottom of the via, and the exposed portion of the first passivating layer, to complete the formation of trench and via openings in a dual damascene process;

(l) forming a barrier and copper seed layer in said trench and via openings;

(m) plating copper on said copper seed layer, filling trench and via openings with excess copper, then annealing;

(n) removing said copper and planarizing back the excess copper by chemical mechanical polishing, thus completing the fabrication of inlaid copper interconnect wiring and contact vias.

9. The method of claim 8, wherein said semiconductor substrate includes semiconductor device structures such as gate electrodes and source/drain regions.

10. The method of claim 8, wherein said semiconductor substrate includes semiconductor device structures such as gate electrodes, source/drain regions, and multiple levels of metal interconnections.

11. The method of claim 8, wherein said first and second low dielectric layers are a low dielectric constant material or materials selected from the group halogenated SiO, fluorinated silicate glass, deposited by chemical vapor deposition.

12. The method of claim 8, wherein said first and second passivating layers are comprised of SiN.

13. The method of claim 8, wherein said plasma enhanced chemical vapor deposited, SIN conformal layer is selected from group consisting of SiN, thickness in the range between approximately 80 to 150 Angstroms.

14. The method of claim 8, wherein said etching back of the SiN conformal layer to form a plasma enhanced SiN spacer at the bottom of the via opening, is performed by a reactive ion etch.

15. The method of claim 8, wherein said barrier layer is comprised of TaN, thickness in the range between approximately 50 to 2,000 Angstroms.

16. The method of claim 8, wherein said copper seed layer thickness comprises thickness ranges from 50 to 2,000 Angstroms and is deposited by chemical vapor deposition, or by sputtering, physical vapor deposition.

17. The method of claim 8, wherein said plated copper layer is selected from the group comprised of: copper and alloys of copper deposited, by either electroplating (preferred method) or by electroless plating, upon the copper seed layer, with a plating copper thickness, with a plated copper thickness approximately from b 1to 10 microns thick.

18. The method of claim 8, wherein the plated thick copper undergoes an annealing step using rapid thermal annealing step, ramping the temperature from between 50 to 450° C.

19. The method of claim 8, wherein said excess copper is planarized back by chemical mechanical polishing to form inlaid copper interconnect wiring and contact vias.

20. The method of claim 8, whereby multi-level metal interconnect wiring and contact vias are formed by repeating steps (a) through (n).

21. A method in damascene processing, comprising:
successively providing a passivating layer and a dielectric layer overlying a semiconductor substrate; forming an opening in the dielectric layer to expose the underlying passivating layer; forming a spacer at the bottom of the opening, with an etching rate substantially same as the passivating layer, to cover a portion of the exposed passivating layer; and, in the same process step, removing the spacer and the exposed portion of the passivating layer to form a properly shaped opening in the passivating layer.

22. The method of claim 21, wherein said semiconductor substrate includes semiconductor device structures such as gate electrodes and source/drain regions.

23. The method of claim 21, wherein said semiconductor substrate includes semiconductor device structures such as gate electrodes, source/drain regions, and multiple levels of metal interconnections.

24. The method of claim 21, wherein said dielectric layer is a low dielectric constant material or materials selected from the group halogenated SiO, fluorinated silicate glass, deposited by chemical vapor deposition.

25. The method of claim 21, wherein said passivating layer comprises SiN.

26. The method of claim 21, wherein said spacer comprises SiN.

* * * * *